(12) United States Patent
Ro et al.

(10) Patent No.: US 8,116,129 B2
(45) Date of Patent: Feb. 14, 2012

(54) VARIABLE RESISTANCE MEMORY DEVICE AND METHOD OF MANUFACTURING THE SAME

(75) Inventors: Yu-hwan Ro, Seoul (KR); Byung-gil Choi, Yongin-si (KR); Woo-yeong Cho, Suwon-si (KR); Hyung-rok Oh, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/872,876

(22) Filed: Aug. 31, 2010

(65) Prior Publication Data
US 2010/0320433 A1 Dec. 23, 2010

Related U.S. Application Data

(62) Division of application No. 11/865,491, filed on Oct. 1, 2007, now Pat. No. 7,808,815.

(30) Foreign Application Priority Data

Oct. 2, 2006 (KR) .......... 10-2006-0097305

(51) Int. Cl.
*G11C 11/00* (2006.01)
(52) U.S. Cl. ........... 365/163; 365/100; 365/148; 257/2; 977/754
(58) Field of Classification Search ............ 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| 2001/0002882 | A1* | 6/2001 | Shimazaki et al. | 365/51 |
| 2004/0165424 | A1* | 8/2004 | Tsang | 365/171 |
| 2006/0120148 | A1* | 6/2006 | Kim et al. | 365/163 |
| 2006/0215440 | A1* | 9/2006 | Cho et al. | 365/148 |
| 2006/0226459 | A1* | 10/2006 | Oh et al. | 257/296 |

* cited by examiner

*Primary Examiner* — Richard Elms
*Assistant Examiner* — Harry W Byrne
(74) *Attorney, Agent, or Firm* — F. Chau & Associates, LLC

(57) ABSTRACT

A variable resistance memory device includes a substrate, a plurality of active lines formed on the substrate, are uniformly separated, and extend in a first direction, a plurality of switching devices formed on the active lines and are separated from one another, a plurality of variable resistance devices respectively formed on and connected to the switching devices, a plurality of local bit lines formed on the variable resistance devices, are uniformly separated, extend in a second direction, and are connected to the variable resistance devices, a plurality of local word lines formed on the local bit lines, are uniformly separated, and extend in the first direction, a plurality of global bit lines formed on the local word lines, are uniformly separated, and extend in the second direction, and a plurality of global word lines formed on the global bit lines, are uniformly separated, and extend in the first direction.

11 Claims, 6 Drawing Sheets

VARIABLE RESISTANCE MEMORY DEVICE AND METHOD OF MANUFACTURING THE SAME

CROSS-REFERENCE TO RELATED FOREIGN APPLICATION

This application is a divisional of, and claims priority from U.S. application Ser. No. 11/865,491 filed in the United States Patent and Trademark Office on Oct. 1, 2007, now U.S. Pat. No. 7,808,815 which in turn claims priority from Korean Patent Application No. 10-2006-0097305 filed on Oct. 2, 2006 in the Korean Intellectual Property Office, the contents of which are herein incorporated by reference in their entirety.

BACKGROUND OF THE INVENTION

1. Field of the Invention

The present disclosure is directed to a variable resistance memory device and method of manufacturing the same.

2. Description of the Related Art

With an ever-increasing demand for reduction of the power consumption of memory devices, research has been conducted on next-generation memory devices that are nonvolatile and do not need a refresh operation. Examples of next-generation memory devices that are nonvolatile and do not need a refresh operation include phase change random access memory (PRAM) devices using phase change materials, resistive random access memory (RRAM) devices using variable resistance materials such as transition metal oxides, and magnetic random access memory (MRAM) devices using ferromagnetic materials. The materials of next-generation memory devices such as PRAM, RRAM, and MRAM devices have a resistance that varies according to a current or voltage applied thereto and maintain a uniform resistance even after the current or voltage is cut off. In other words, since next-generation memory devices such as PRAM, RRAM, and MRAM devices have nonvolatile properties, they do not need a refresh operation.

FIG. 1 is a circuit diagram of a memory cell 10 of a typical next-generation memory device.

Referring to FIG. 1, the memory cell 10 includes a variable resistance device 11 and a switching device 12.

The variable resistance device 11 is connected between a bit line BL and the switching device 12, and the switching device 12 is connected between the variable resistance device 11 and a word line WL.

A next-generation memory device including the memory cell 10 may be classified as being a PRAM, RRAM, or MRAM device according to the type of the variable resistance device 11. In other words, if the next-generation memory device including the memory cell 10 is a PRAM device, then the variable resistance device 11 may be formed of a material whose resistance varies according to temperature, such as Ge—Sb—Te (GST). If the next-generation memory device including the memory cell 10 is an RRAM device, then the variable resistance device 11 may be formed of a transition metal oxide and may be interposed between an upper electrode and a lower electrode. If the next-generation memory device including the memory cell 10 is an MRAM device, then the variable resistance device 11 may be comprised of an insulator that is interposed between upper and lower electrodes of a magnetic material.

PRAM cells are disclosed in U.S. Pat. No. 6,760,017, RRAM cells are disclosed in U.S. Pat. No. 6,753,561, and MRAM cells are disclosed in U.S. Pat. No. 6,724,674.

In the meantime, as the demand for increasing the storage capacity of a memory device increases, the size of memory chips has gradually increased. Accordingly, the resistance, the parasitic resistance, and the capacitance of each signal line in a memory device increase, thereby imposing restrictions on the memory device's ability to perform operations at high speed. In order to address this challenge, methods of forming a hierarchy of signal lines have been applied to typical DRAM devices, and an example of these methods is disclosed in U.S. Pat. No. 6,069,815.

In order to increase the storage capacity and operating speed of next-generation memory devices that use variable resistance materials, signal lines must be formed hierarchically. Therefore, it is desirable to develop a new hierarchical layout of signal lines for variable resistance memory cells, in which each variable resistance memory cell is comprised of a variable resistance device and a switching device.

SUMMARY OF THE INVENTION

An embodiment of the present invention provides a variable resistance memory device which can provide high memory cell efficiency.

An embodiment of the present invention also provides a method of manufacturing a variable resistance memory device which can provide high memory cell efficiency.

These and other objects will be described in or be apparent from the following description of exemplary embodiments.

According to an aspect of the present invention, there is provided a variable resistance memory device. The variable resistance memory device includes a silicon substrate, a plurality of active lines which are formed on the silicon substrate, are uniformly separated, and extend in a first direction, a plurality of switching devices which are formed on the active lines and are separated from one another, a plurality of variable resistance devices which are respectively formed on and connected to the switching devices, a plurality of local bit lines which are formed on the variable resistance devices, are uniformly separated, extend in a second direction, and are connected to the variable resistance devices, a plurality of local word lines which are formed on the local bit lines, are uniformly separated, and extend in the first direction, a plurality of global bit lines which are formed on the local word lines, are uniformly separated, and extend in the second direction, and a plurality of global word lines which are formed on the global bit lines, are uniformly separated, and extend in the first direction.

According to another aspect of the present invention, there is provided a variable resistance memory device including a silicon substrate, a plurality of active lines which are formed on the silicon substrate, are uniformly separated, and extend in a first direction, a plurality of switching devices which are formed on the active lines and are separated from one another, a plurality of variable resistance devices which are respectively formed on and connected to the switching devices, a plurality of local bit lines which are formed on the variable resistance devices, are uniformly separated, extend in a second direction, and are connected to the variable resistance devices, a plurality of local word lines which are formed on the local bit lines, are uniformly separated, and extend in the first direction, and a plurality of contacts which are formed for each group of variable resistance devices in the first direction and connect the plurality of active lines and the plurality of local word lines.

According to still another aspect of the present invention, there is provided a method of manufacturing a variable resistance memory device including forming a plurality of active lines on a silicon substrate so that the active lines are uniformly separated and extend in a first direction, forming a plurality of switching devices on the active lines so that the switching devices are uniformly separated, forming a plurality of variable resistance devices on the switching devices, forming a plurality of local bit lines on the variable resistance devices so that the local bit lines are uniformly separated, extend in a second direction, and are connected to the variable resistance devices, forming a plurality of local word lines on the local bit lines so that the local word lines extend in the first direction, forming a plurality of global bit lines on the local word lines so that the global bit lines extend in the second direction, and forming a plurality of global word lines on the global bit lines so that the global word lines extend in the first direction.

BRIEF DESCRIPTION OF THE DRAWINGS

The above and other features of the embodiments of the present invention will become more apparent by describing in detail exemplary embodiments thereof with reference to the attached drawings.

DETAILED DESCRIPTION OF EXEMPLARY EMBODIMENTS

Figure 1:
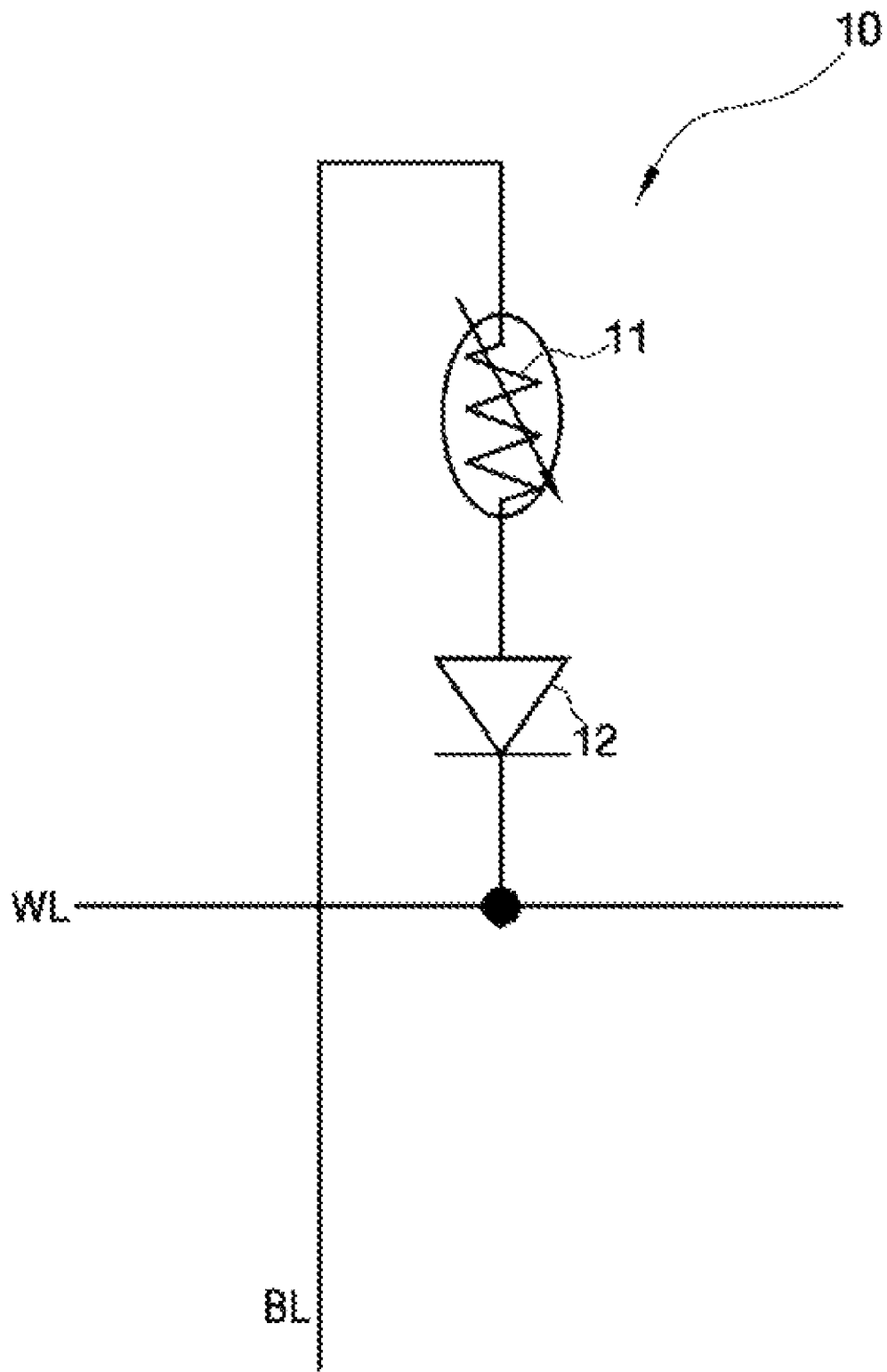
FIG. 1 is a circuit diagram of a memory cell using a general variable resistance memory device.

Features of embodiments of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

For the convenience of explanation, while the invention will be described with regard to a PRAM device by way of example in the following embodiments, it is to be appreciated that the invention can also be applied to RRAM, and MRAM devices.

Figure 2:
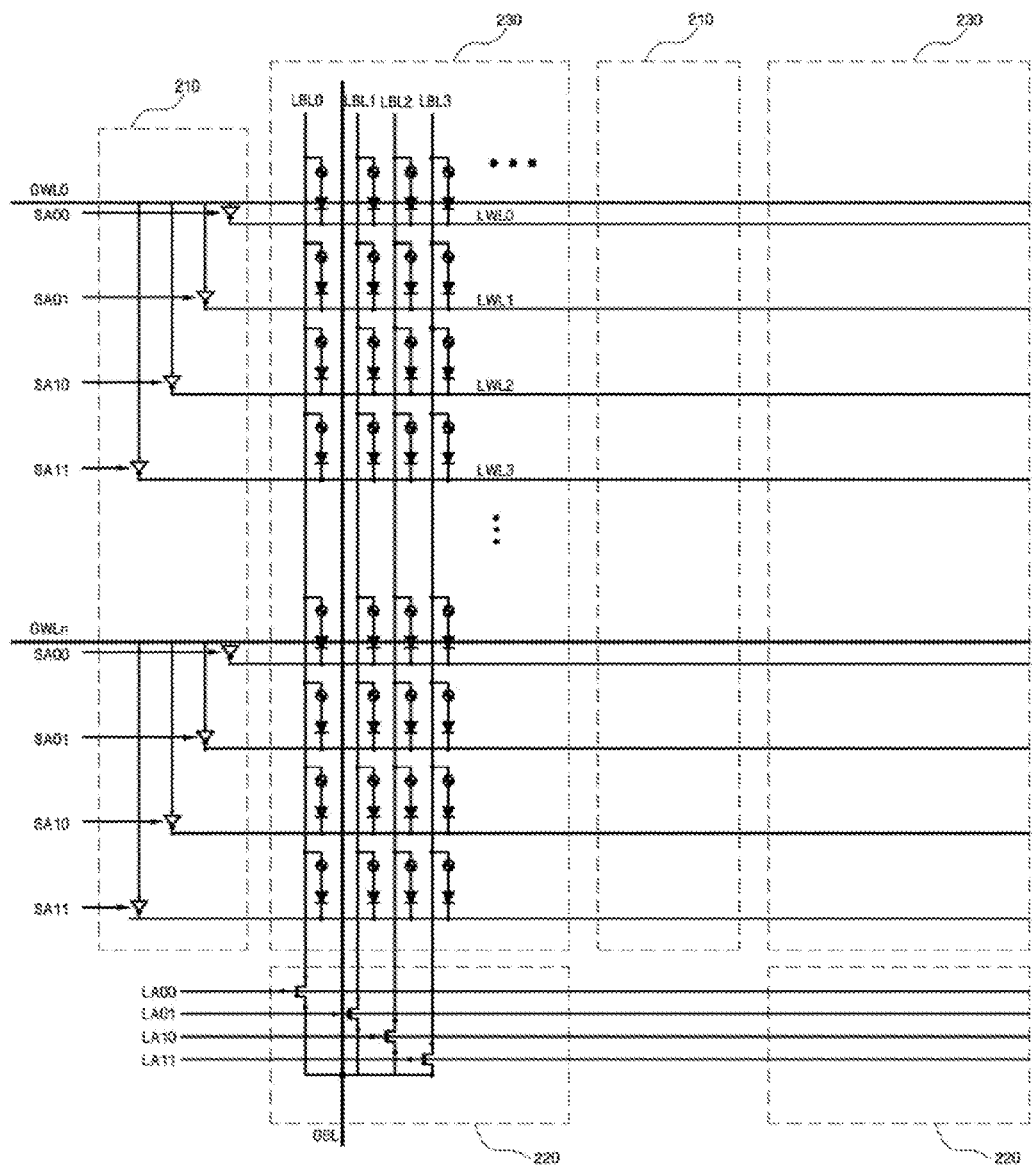
FIG. 2 is a circuit diagram of a memory cell array of a variable resistance memory device according to an embodiment of the present invention.

FIG. 2 is a circuit diagram of a memory cell array of a semiconductor memory device 200 according to an embodiment of the present invention. Referring to FIG. 2, the semiconductor memory device 200 includes a local word line driver region 210, a local bit line selection region 220, and a memory cell array region 230.

A plurality of drivers are located in the local word line driver region 210. That is to say, the drivers are respectively connected to a plurality of global word lines GWL0 through GWLn, and select and activate one of a plurality of local word lines LWL0 through LWL3 in response to a plurality of local word line selection signals SA00 through SA11. The drivers may be realized as inverters, but the present invention is not restricted thereto.

A plurality of switches are located in the local bit line selection region 220. The switches connect a global bit line GBL to one of the local bit lines LBL0 through LBL3 in response to a plurality of local bit line selection signals LA00 through LA11. Each of the switches may be comprised of only one NMOS transistor, but the present invention is not restricted thereto.

The local word lines LWL0 through LWL3 and the local bit lines LBL0 through LBL3 are arranged in the memory cell array region 230. The local bit lines LBL0 through LBL3 intersect the local word lines LWL0 through LWL3. A plurality of variable resistance memory cells, like the one illustrated in FIG. 1, are respectively disposed at the intersection between the local bit lines LBL0 through LBL3 and the local word lines LWL0 through LWL3. The semiconductor memory device 200 may be a Phase change Random Access Memory (PRAM), Resistive Random Access Memory (RRAM) or Magnetic Random Access Memory (MRAM) device according to the materials of the variable resistance memory cells.

In other words, a plurality of word lines or bit lines for selecting each of the variable resistance memory cells of the semiconductor memory device 200 are formed hierarchically as the global word lines GWL0 through GWLn and the local word lines LWL0 through LWL3 or as the global bit lines GBL and the local bit lines LBL0 through LBL3.

Figure 3:
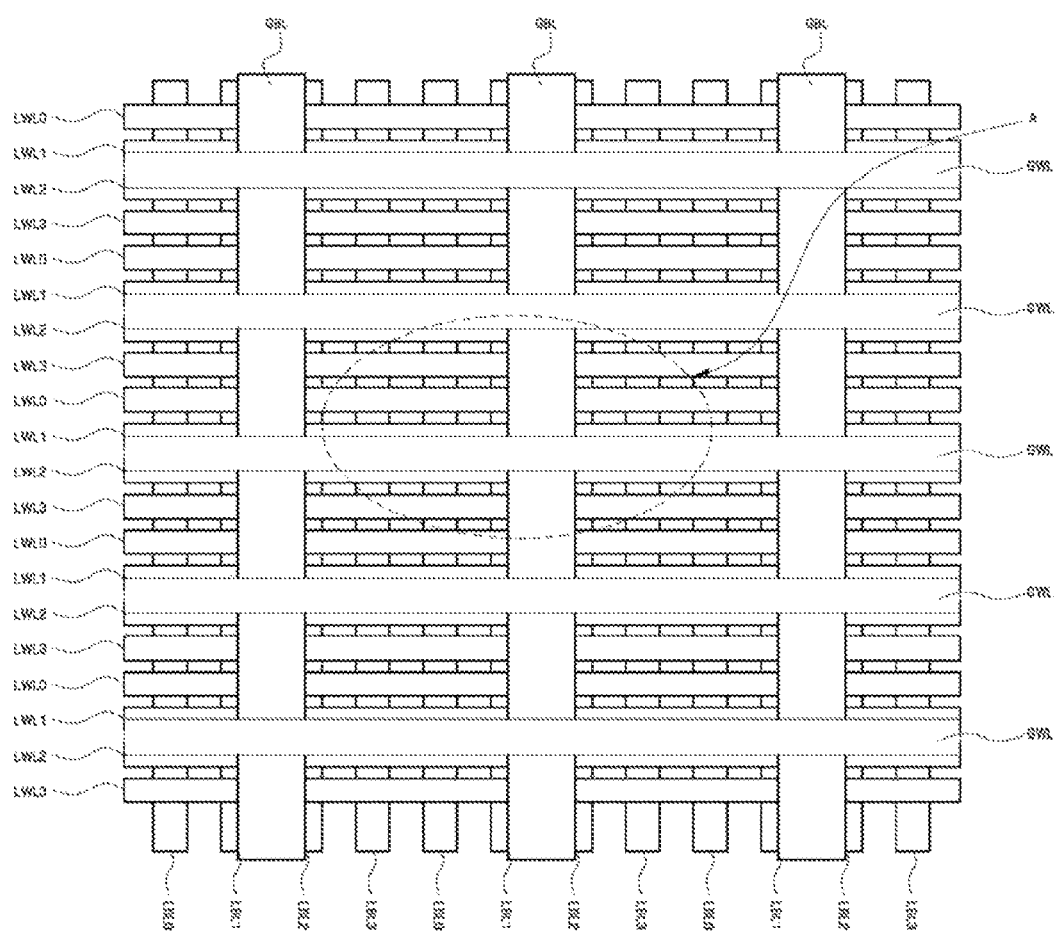
FIG. 3 is a layout diagram of a hierarchical signal line structure of the memory cell array illustrated in FIG. 2.

FIG. 3 is a layout diagram of a hierarchical signal line structure of the memory cell array illustrated in FIG. 2. Referring to FIG. 3, the memory cell array includes a plurality of global word lines GWL, a plurality of local word lines LWL0 through LWL3, a plurality of global bit lines GBL and a plurality of local bit lines LBL0 through LBL3.

The global word lines GWL and the local word lines LWL0 through LWL3 are formed in a first direction, and the global bit lines GBL and the local bit lines LBL0 through LBL3 are formed in a second direction that is perpendicular to the first direction. The first direction may be a row direction, and the second direction may be a column direction.

The local bit lines LBL0 through LBL3, the local word lines LWL0 through LWL3, the global bit lines GBL, and the global word lines GWL may be formed of a metal having high conductivity. The local bit lines LBL0 through LBL3, the local word lines LWL0 through LWL3, the global bit lines GBL, and the global word lines GWL may be formed in different interconnection layers. In other words, the local bit lines LBL0 through LBL3 may be formed in a first metal interconnection layer, the local word lines LWL0 through LWL3 may be formed in a second metal interconnection layer, the global bit lines GBL may be formed in a third metal interconnection layer, and the global word lines GWL may be formed in a fourth metal interconnection layer. An insulation layer is formed among the first through fourth metal interconnection layers.

Also, four local bit lines (LBL0 through LBL3) are allocated for each of the global bit lines GBL, and four local word lines (LWL0 through LWL3) are allocated for each of the global word lines GWL. The number of local bit lines allocated for each of the global bit lines GBL or the number of local word lines allocated for each of the global word lines GWL may be increased to 2n (where n is a natural number).

Figure 4:
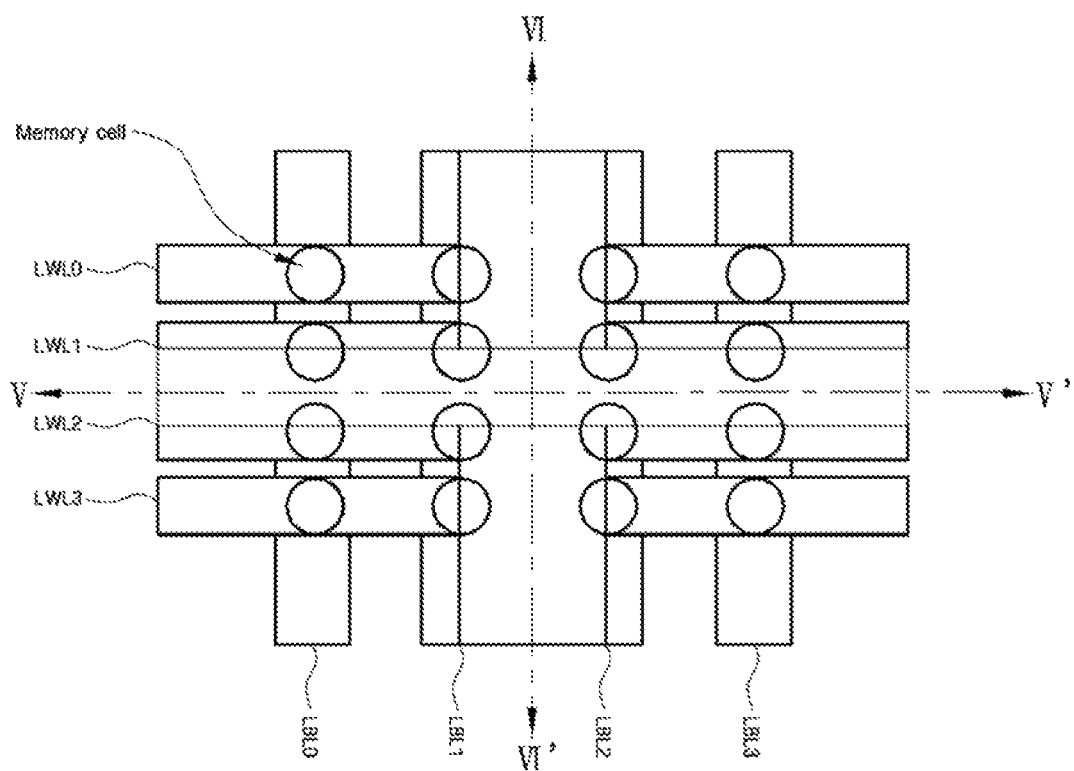
FIG. 4 is an enlarged view of portion A of FIG. 3 and illustrates a cross point memory cell structure, according to an embodiment of the invention.

FIG. 4 is an enlarged view of portion A of FIG. 3, and illustrates a cross point memory cell structure. In the cross point memory cell structure, memory cells have the same size as the intersection between word lines and a bit lines. A semiconductor memory device having the cross point memory cell structure can maximize memory cell efficiency.

Referring to FIG. 4, a plurality of variable resistance memory cells are respectively located at intersection between a plurality of local word lines LWL0 through LWL3 and a plurality of local bit lines LBL0 through LBL3, as indicated by circles, thereby realizing a cross point memory cell structure.

Figure 5:
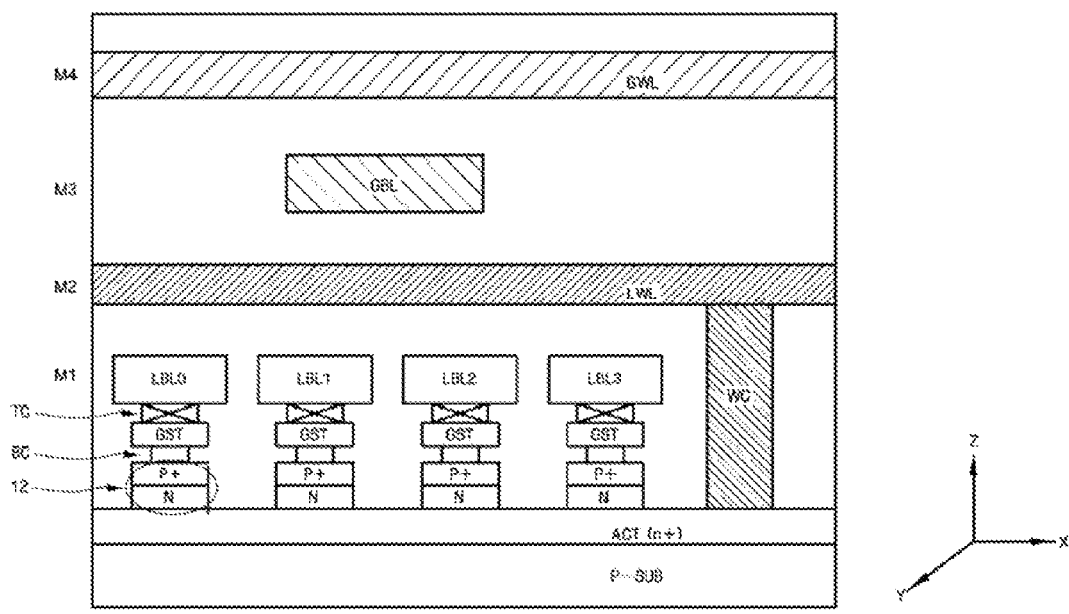
FIG. 5 is a cross-sectional view of a memory cell array illustrated in FIG. 4, taken in a first direction.
Figure 6:
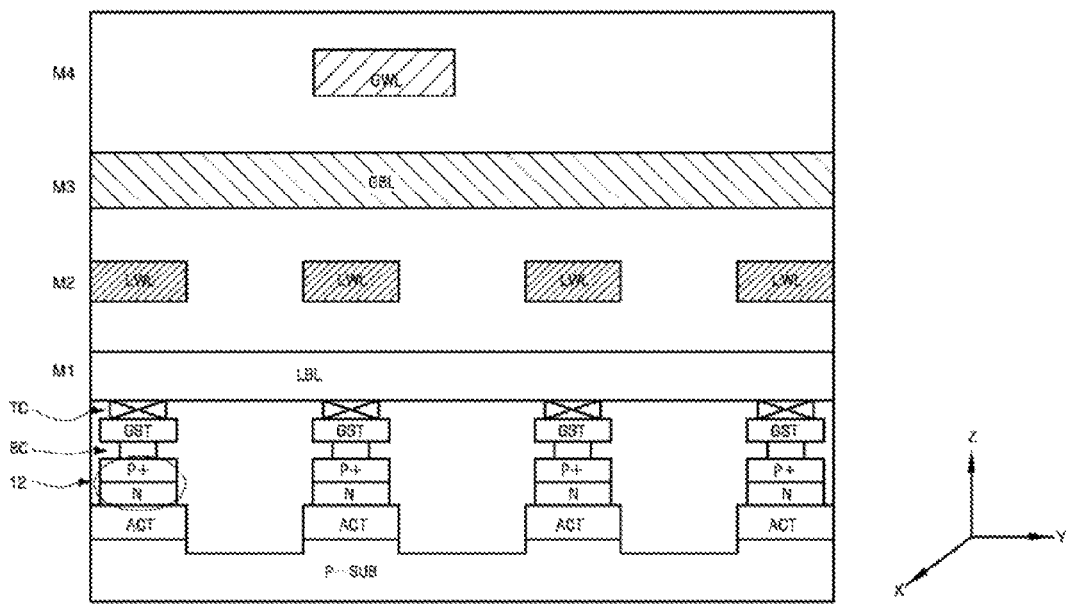
FIG. 6 is a cross-sectional view of the memory cell array illustrated in FIG. 4, taken in a second direction.

FIG. 5 is a cross-sectional view of the memory cell array illustrated in FIG. 4, taken in a first direction V-V', and FIG. 6 is a cross-sectional view of the memory cell array illustrated in FIG. 4, taken in a second direction VI-VI'. The layout of a semiconductor memory device according to an embodiment of the present invention, and a method of manufacturing a semiconductor memory device according to an embodiment of the present invention will hereinafter be described in detail with reference to FIGS. 3 through 6.

Referring to FIGS. 3 through 6, a plurality of active lines ACT are formed on a semiconductor substrate P-SUB, and are uniformly separated. The active lines ACT extend in the first direction (e.g., an x-direction). The active lines ACT may be formed of an n+-type material doped with a high concentration of impurities.

A plurality of switching devices 12 are formed on the active lines ACT so that the switching devices 12 are separated from one another. The switching devices 12 may be diodes. The switching devices 12 may be formed using a selective epitaxial growth method. The cathodes of the diodes comprising the switching devices 12 are connected to the active lines ACT.

A plurality of lower contacts BC are respectively formed on the switching devices 12. The lower contacts BC electrically connect the anodes of the switching devices 12 to a plurality of local bit lines LBL0 through LBL3.

Thereafter, a plurality of variable resistance elements GST are respectively formed on the lower contacts BC. Here, the variable resistance elements GST may be formed of a variety of types of compounds, including a binary (two-element) compound such as GaSb, InSb, InSe, $Sb_2Te_3$, or GeTe, a ternary (three-element) compound such as GeSbTe, GaSeTe, InSbTe, $SnSb_2Te_4$, or InSbGe, or a quaternary (four-element) compound such as AgInSbTe, (GeSn) SbTe, GeSb (SeTe), or $Te_{81}Ge_{15}Sb_2S_2$. The anodes of the diodes comprising the switching devices 12 are connected to the variable resistance elements GST.

Thereafter, a plurality of upper contacts TC are respectively formed on the variable resistance elements GST, thereby completing the formation of a plurality of variable resistance memory cells.

First through fourth metal interconnection layers M1 through M4 for accommodating a plurality of signal lines that are used to select each of the variable resistance memory cells are formed on the variable resistance memory cells.

The local bit lines LBL0 through LBL3 are formed in the first metal interconnection layer M1, which is the lowermost interconnection layer of the first through fourth metal interconnection layers M1 through M4. The local bit lines LBL0 through LBL3 are uniformly separated and extend in the second direction (e.g., a y-direction). The local bit lines LBL0 through LBL3 are connected to the variable resistance elements GST via the upper contacts TC.

A plurality of local word lines LWL0 through LWL3 are formed in the second metal interconnection layer M2, which is formed on the first metal interconnection layer M1, and extend in the first direction (e.g., the x-direction). The local word lines LWL0 through LWL3 are uniformly separated. The local word lines LWL0 through LWL3 respectively correspond to the active lines ACT, and are connected to the active lines ACT via word line contacts WC. In particular, the word line contacts WC are arranged only in sub-word line drive regions illustrated in FIG. 3. In order to reduce the resistance of the active lines ACT, however, the word line contacts WC may also be formed for each group of memory cells.

Figure 7:
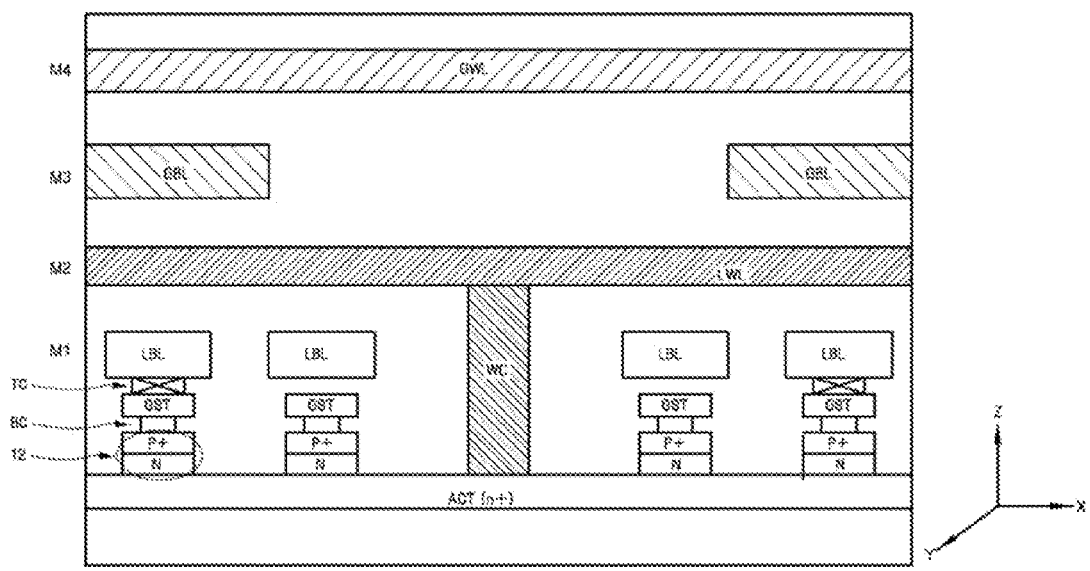
FIG. 7 is a cross-sectional view of a variable resistance memory device according to another embodiment of the present invention.

Memory cells that are adjacent to the word line contacts WC are formed using a different method from those used to form memory cells that are not adjacent to the word line contacts WC, and thus has different properties from memory cells that are not adjacent to the word line contacts WC. Referring to FIG. 7, upper contacts TC may not be formed on variable resistance elements GST for memory cells that are adjacent to word line contacts WC. In other words, the memory cells that are adjacent to the word line contacts WC may serve as dummy memory cells. The dummy memory cells that are adjacent to the word line contacts WC may be formed in the second direction (e.g., the y-direction).

A plurality of global bit lines GBL are formed in the third metal interconnection layer M3, which is formed on the second metal interconnection layer M2. The global bit lines GBL are uniformly separated, and extend in the second direction (e.g., the y-direction). Four local bit lines LBL0 through LBL3 are allocated for each of the global bit lines GBL, and each of the global bit lines GBL is selectively connected to the four local bit lines LBL0 through LBL3 in response to a plurality of local bit line selection signals LA00 through LA11 by a plurality of selection transistors in the local bit line selection region 220 illustrated in FIG. 2.

A plurality of global word lines GWL are formed in the fourth metal interconnection layer M4, which is formed on the third metal interconnection layer M3. The global word lines GWL are uniformly separated, and extend in the first direction (e.g., the x-direction). Four local word lines LWL0 through LWL3 are allocated for each of the global word lines GWL, and each of the global word lines GWL is selectively connected to the four local word lines LWL0 through LWL3 by respective drivers in the local word line driver region 210 illustrated in FIG. 2.

The local bit lines LBL0 through LBL3, the local word lines LWL0 through LWL3, the global bit lines GBL, and the global word lines GWL may be formed of a metal having high conductivity. An insulation layer may be formed among the first through fourth metal interconnection layers M1 through M4 in order to electrically insulate the first through fourth metal interconnection layers M1 through M4 from one another.

According to the embodiment illustrated in FIGS. 2 through 4, four local bit lines are allocated for each global bit line, and four local word lines are allocated for each global word line. However, the present invention is not restricted to this. In other words, the number of local bit lines allocated for each global bit line or the number of local word lines allocated for each global word line may be altered.

According to another embodiment of the invention, a plurality of global word lines GWL are formed in the third metal interconnection layer M3, which is formed on the second metal interconnection layer M2. Also, a plurality of global bit lines GBL are formed in the fourth metal interconnection layer M4, which is formed on the third metal interconnection layer M3.

As described above, according to an embodiment of the present invention, a plurality of local bit lines, local word lines, global bit lines, and global word lines are formed in different interconnection layers, thus enabling a memory device to perform its operations at high speed. In addition, according to an embodiment of the present invention, a plurality of variable resistance memory cells are respectively formed at the intersection between a plurality of local bit lines and a plurality of local word lines, thus guaranteeing optimum memory cell efficiency.

While embodiments of the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A variable resistance memory device comprising:
    a silicon substrate;
    a plurality of active lines which are formed on the silicon substrate, are uniformly separated, and extend in a first direction;
    a plurality of switching devices which are formed on the active lines and are separated from one another;
    a plurality of variable resistance devices which are respectively formed on and connected to the switching devices;
    a plurality of local bit lines which are formed on the variable resistance devices, are uniformly separated, extend in a second direction, and are connected to the variable resistance devices;
    a plurality of local word lines which are formed on the local bit lines, are uniformly separated, and extend in the first direction; and
    a plurality of contacts which are formed for each group of variable resistance devices in the first direction and connect the plurality of active lines and the plurality of local word lines,
    a plurality of global word lines; and
    a plurality of global bit lines,
    wherein the local bit lines, the local word lines, the global bit lines, and the global word lines are formed in different interconnection layers.

2. The variable resistance memory device of claim 1, wherein variable resistance devices that are adjacent to the contacts are not connected to any local bit line and form dummy memory cells.

3. The variable resistance memory device of claim 2, wherein the dummy memory cells are separated in the second direction.

4. The variable resistance memory device of claim 1, wherein:
    the global bit lines are formed on the local word lines, are uniformly separated, and extend in the second direction; and
    the global word lines are formed on the global bit lines, are uniformly separated, and extend in the first direction.

5. The variable resistance memory device of claim 1, wherein:
    the global word lines are formed on the local word lines, are uniformly separated, and extend in the first direction; and
    the global bit lines are formed on the global word lines, are uniformly separated, and extend in the second direction.

6. A method of manufacturing a variable resistance memory device comprising:
    forming a plurality of active lines on a silicon substrate so that the active lines are uniformly separated and extend in a first direction;
    forming a plurality of switching devices on the active lines so that the switching devices are uniformly separated;
    forming a plurality of variable resistance devices on the switching devices;
    forming a plurality of local bit lines on the variable resistance devices so that the local bit lines are uniformly separated, extend in a second direction, and are connected to the variable resistance devices;
    forming a plurality of local word lines on the local bit lines so that the local word lines extend in the first direction;
    forming a plurality of global bit lines on the local word lines so that the global bit lines extend in the second direction; and
    forming a plurality of global word lines on the global bit lines so that the global word lines extend in the first direction.

7. The method of claim 6, further comprising forming a plurality of contacts which connect the local word lines correspond to the active lines, respectively.

8. The method of claim 6, wherein the switching devices comprise diodes, and are formed using a selective epitaxial growth method.

9. The method of claim 8, further comprising forming a plurality of lower contacts between the diodes and the variable resistance devices.

10. The method of claim 9, further comprising forming a plurality of upper contacts between the variable resistance devices and the local bit lines.

11. The method of claim 7, further comprising forming a plurality of upper contacts between the variable resistance devices and the respective local bit lines, but not between variable resistance devices that are adjacent to the contacts and respective corresponding local bit lines.

* * * * *